May 25, 1971 E. J. TRAYNOR, JR 3,580,737

CHEMICAL RADIUSING CONDUCTOR EDGES OF FLAT CABLE

Filed Jan. 18, 1968 2 Sheets-Sheet 1

FIG. I.

WITNESSES:
Leon M. Garman
Daniel P. Cillo

INVENTOR
Edward J. Traynor Jr.
BY Alex Mich, Jr.
ATTORNEY

CHEMICAL RADIUSING CONDUCTOR EDGES OF FLAT CABLE

Filed Jan. 18, 1968

United States Patent Office 3,580,737
Patented May 25, 1971

3,580,737

CHEMICAL RADIUSING CONDUCTOR EDGES OF FLAT CABLE

Edward J. Traynor, Jr., Stoughton, Mass., assignor to Westinghouse Electric Corporation, Pittsburgh, Pa.
Filed Jan. 18, 1968, Ser. No. 698,968
Int. Cl. C23b *1/02;* B44d *1/18*
U.S. Cl. 117—212 10 Claims

ABSTRACT OF THE DISCLOSURE

A metal foil is coated on one side with a resinous film. An etch resist coating is deposited on the metallic foil in a predetermined pattern to produce a desired configuration of metal conductor strips after the composite is passed first through a metal etching solution and then a solution which removes the resist coating. The resulting flat metallic conductors have sharp undercut etched edges. The composite is again passed through a metal etching solution. The sharp conductor edges are thereby rounded so that the metallic conductors are reduced to a cross section without sharp edges. The exposed conductors are coated with a resinous film to complete the insulation of the conductors. The rounded edges of the conductors permit the cable to be creased without cracking the insulation.

BACKGROUND OF THE INVENTION

This invention relates to discrete multiconductor flexible electrical wiring members having etched conductors and to methods for manufacturing them. More particularly, this invention relates to methods of producing a more creasable spaced, multiconductor flat cable.

Complex circuits and electronic systems have become important in the fields of aircraft controls, missile guidance, telemetry, computer wiring, business machines, radar, radio and television and other signaling equipment. Thin, flat multiple conductor wiring cable represents an effort to simplify the problems encountered in such complex systems. Flat cables have been fabricated by sandwiching spaced flat metallic conductors between an upper and a lower surface of performed insulating film. Usually, an adhesive is also employed between the film layers to bond the conductors and insulation together. The composite is then passed between heated rolls to produce a bonded thin laminate structure. Another or second method of fabricating flat cables has been to etch the metallic conductors on the exposed metal foil of a foil-resinous film composite. Such composites may be conveniently produced by depositing a resinous film directly onto one face of a metal foil strip.

A problem may arise when certain superior but notch sensitive resin films are employed as insulation. In the adhesive method of manufacture of flat cables the adhesive layer acts as a buffer zone between the flat conductor edges and the film. In the second method of manufacture upon coating directly over the conductors, the sharp etched edges build a notch into the resulting film. When such a cable, insulated with a notch-sensitive film, is creased in any direction, a crack may occur along the sharp edges and propagate indefinitely.

Certain other disadvantages are inherent in the adhesive method however. There, since the composite structure must be passed between heated pressure rolls, it is difficult to maintain accurate conductor spacing. The film must be sufficiently heated to actually soften it so that the conductors can be bonded and sealed therebetween. At this stage, there is a pronounced tendency for the conductors, even though they are small and thin, to slip out of proper registry. This method tends to use films of low softening points and produces problems of the conductors floating in the adhesive and touching when the cable is subject to mechanical stress while exposed to elevated temperatures.

The second method of manufacture described above allows an adhesiveless cable to be fabricated and allows coating on both sides using the same equipment thus eliminating a laminator. It also allows utilization of a wider variety of insulations. The basic problem of notch sensitivity that may occur in etched cables has been solved by this invention.

SUMMARY

It is the general object of this invention to provide new, improved and more flexible flat multiconductor cables.

It is another object of this invention to provide new and improved methods of fabricating flexible flat multiconductor cables so that these cables can be creased in all directions without cracking.

Briefly, the present invention accomplishes the above cited objects by coating one side of a relatively wide metallic foil strip with a resinous solution, converting the deposited coating to a flexible solidified resinous film, applying an appropriate resist coating on the uncoated foil surface in a pattern for the desired relatively narrow conductor configuration, removing the unwanted foil by etching, removing the resist layer, rounding off the sharp conductor edges by a re-etching process and finally depositing a layer of insulation over the exposed conductor pattern.

BRIEF DESCRIPTION OF THE DRAWING

Further objects and advantages of the invention will become apparent as the following description proceeds and features of novelty which characterize the invention will be pointed out in particularity in the claims annexed to and forming a part of this specification.

For a better understanding of the invention, reference may be had to the accompanying drawings in which.

DESCRIPTION OF THE PREFERRED EMBODIMENTS

Figure 1:
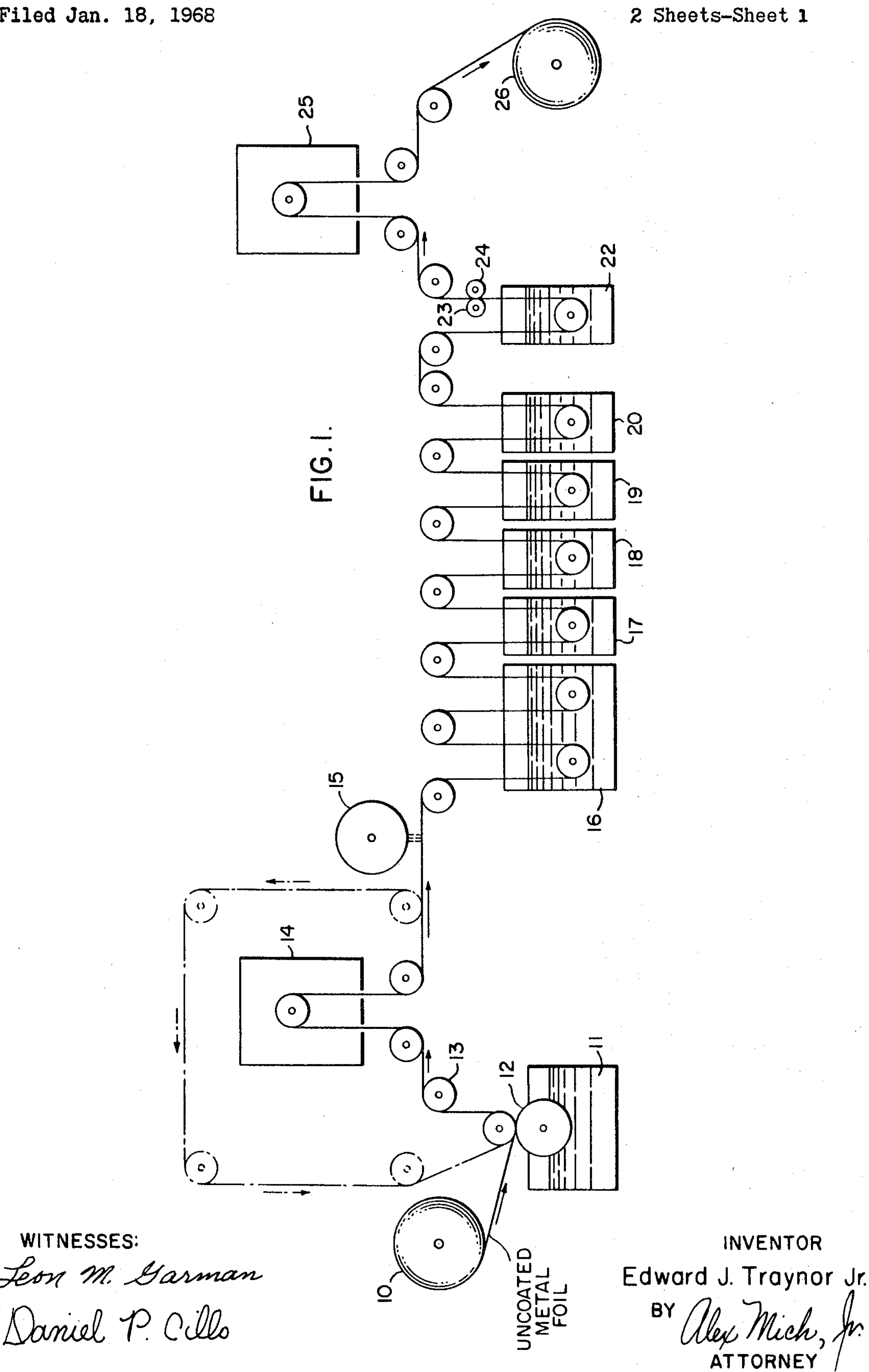
FIG. 1 is a schematic elevation illustrating the preparation of flat flexible, multiconductor cable in accordance with this invention.

It has now been discovered that new and improved, flexible multiconductor cable or electrical members may be comprised of a series of individual or discrete, spaced, thin, coplanar, metallic conductors reduced to a cross section without sharp edges, supported and insulated by at least one, but preferably two films of solidified aromatic polyimide or polyamide-imide resin. Such cables may be conveniently produced in a continuous manner.

Suitable resinous films for insulating and supporting the thin metallic conductors, in accordance with this invention are known as aromatic polyimides or polyamide-imides and have the recurring unit:

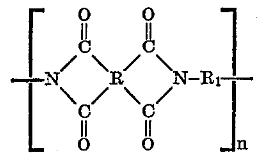

wherein $n$ is at least 15, R is at least one tetravalent organic radical selected from the group consisting of:

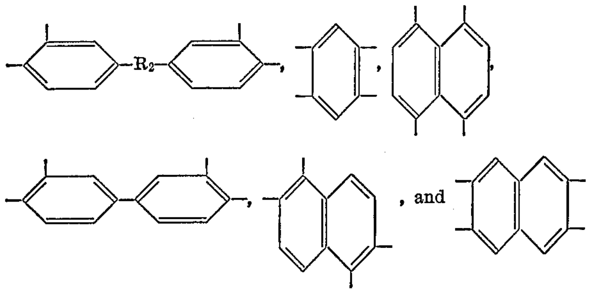

$R_2$ being selected from the group consisting of divalent aliphatic hydrocarbon radicals having from 1 to 4 carbon atoms and carbonyl, oxy, sulfo and sulfonyl radicals and in which $R_1$ is at least one divalent radical selected from the group consisting of:

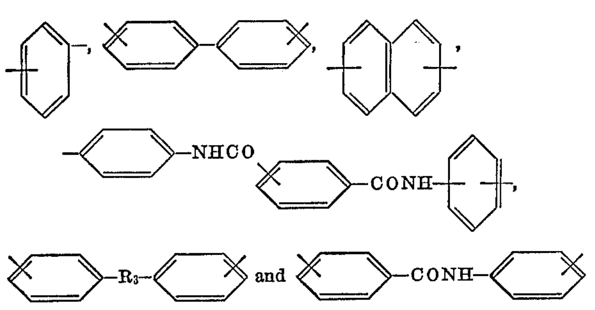

in which $R_3$ is a divalent organic radical selected from the group consisting of $R_2$, silico and amido radicals. Polymers containing two or more of the R and/or $R_1$ radicals, especially multiple series of $R_1$ containing amido radicals, are particularly valuable in some instances. The resinous materials described are capable of being formed into thin films supporting and insulating thin conductors as flexible composites.

The aromatic polyamide-imide resins, represented by certain of the foregoing formulae are described and claimed in U.S. Pat. 3,179,635 assigned to the assignee of this invention, and reference may be made thereto for details on the methods of preparing those resins. For additional details reference may also be made to an article by Frost and Bower, entitled, "Aromatic Polyimides," in J. Polymer Science, Part A, vol. 1, pp. 3135–3150 (1963). Reference may be had to U.S. Pats. 3,179,631; 3,179,632; 3,179,633 and 3,179,634 for details on preparing aromatic polyimide resins.

The described essentially insoluble solid resinous films are derived from certain soluble aromatic polyamic acid precursors. Since the precursors are soluble, the metallic foil may be passed through a solution of the precursor so that a wet film is deposited on one or both sides of the foil. The wet film is heated to drive off the solvent and to cure the precursor film to its solid resinous state. The preparation of aromatic polyamic acid precursors, suitable for use in this invention, is described in detail in U.S. Pat. 3,179,635 assigned to the assignee of this invention and U.S. Pats. 3,179,614; 3,179,631; 3,179,632; 3,179,633 and 3,179,634.

Aromatic polyamic acids suitable for use in this invention have the recurring unit:

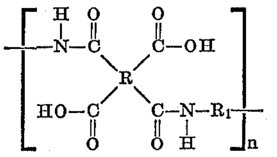

in which $n$ is at least 15 and R and $R_1$ are identical to the description hereinabove relating to the solid aromatic polyimide and polyamide-imide resins. It should be understood that suitable polyamic acid precursors may also contain two or more of the R and/or $R_1$ radicals.

Suitable solvents for the described aromatic polyamic acid precursors are, for example, the normally liquid organic solvents of the N,N-dialkylcarboxylamide class, preferably the lower molecular weight members of this class. Typical examples include dimethyl formamide, dimethyl acetamide, N-methyl pyrrolidone, as well as dimethyl sulfoxide and pyridine. The solvents can be used individually in combinations of two or more, or in combination with relatively poor liquid organic solvents or diluents such for example, as benzene, benzonitrile, dioxane, butyrolactone, xylene, toluene, and cyclohexane. The addition of water in any appreciable amount cannot be tolerated. The solvents are easily removed by heating in a drying tower so that the condensation reaction which takes place in converting the precursors to the solid resin, may be immediately initiated in the heated curing tower. The precursor solutions are all highly viscous and rather low solid concentrations, below about 30% by weight, are recommended if reasonably fluid solutions are desired.

In addition to the aforementioned aromatic polyimide and polyamide-imide recurring unit wherein R was a tetravalent organic radical, resins which are particularly suitable in this invention are derived from a trivalent anhydride and have the structure:

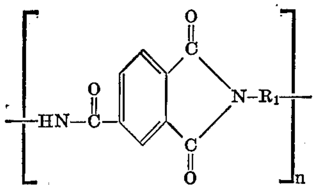

wherein $R_1$ and $n$ are identical to the description hereinabove relating to the solid aromatic polyimide and polyamide-imide resins.

The soluble precursors for the above trivalent derived polyamide-imide resins may be generically described as polyamide acids and include in repeating form one or both of the structures:

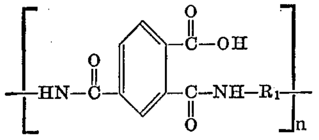

and

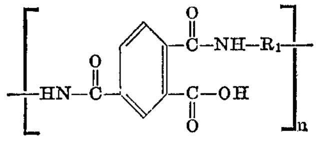

wherein R and $n$ are identical to the description hereinabove. For details on the preparation of these soluble precursors, and the solid resins therefrom, reference may be had to British Pats. 1,056,564 and 1,032,649.

The same solvents as previously described can be used for the above aromatic polyamide acid precursors.

Figure 2:
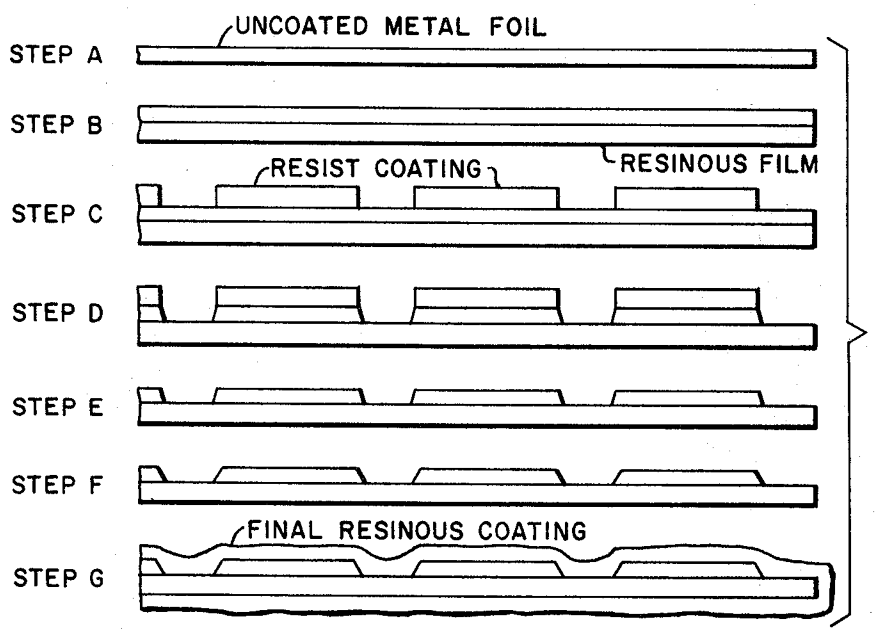
FIG. 2 is a series of cross sectional illustrations of the flat flexible multiple conductor cable in various stages of preparation.

Referring now to FIG. 1, a strip of metal foil, in this instance copper foil, is passed from a payoff reel 10 to the precursor solution tank 11 and kiss coated on one side by contacting the rotating drum 12. The drum 12 is partially submerged in the resin solution. As it is rotated, the drum picks up the precursor resin solution from the bath and transfers it to one side of the foil. The coated foil contacts a grooved metering pin 13 to insure a uniform film thickness. At the speed of about 5 feet per minute, the coated foil passes through a tower or oven 14 heated to about 150° C. at the entry end and about 350° C. at the exit end. In the tower, the solvent is driven off and the presursor is cured to a solid resinous state. Numerous passes are employed to produce the desired final film thickness. The broken line in FIG. 2 schematically illustrates additional passes. A 0.1 to 0.3 mil film per pass is obtained. Heavier builds per pass may be obtained by increasing the viscosity and solids content of the precursor solution and smooth films up to 3 mil per pass may be obtained. Reasonable speeds are possible and equipment similar to typical wire enameling equipment, for example type S towers, may be employed. However speeds slower than 15 feet per minute and thin films in multiple passes are preferred to produce blister-free and blemish-free films. To provide adequate support for the conductors and yet be sufficiently flexible for the processing requirements, film thickness in the order of 1 to 3 mils are preferred. To distinguish from films which may be applied hereinafter, this film may be described as a resinous film backing.

Resist is then applied to the uncoated side of the copper or other metal foil by the fixed extruder head 15. The extruder head 15 has a plurality of openings so that a plurality of parallel strips of resist materials may be continuously deposited on the uncoated side of the foil. The extruder head is heated so that the resist, as for example paraffin wax or a low melting thermoplastic resin may be maintained in molten condition, just above its melting point. When the resist is deposited on the colder foil it solidifies and adheres to the metal foil to mask selected areas or strips from the action of the etching solution.

The masked foil is then passed through a hot etching solution in tank 16. If copper foil is used the etching solution may be ferric chloride or ammonium persulfate. If aluminum foil is used hydrochloric acid is a suitable etchant. A number of passes through the etchant may be required. In the case of copper foil and a 30° ferric chloride solution at approximately 90° C. the immersion time will run 5 to 10 minutes. The foil not protected or masked by the resist is etched away leaving strips of conductive foil identical to the resist pattern. The resist coating is removed by trichloroethylene or other suitable solvent in tank 17. The foil then passes through the neutralizing bath or water rinse in tank 18 to remove contaminants on the foil. At this point the metal conductor edges will be sharp. To round off these knife edges the foil is passed through tank 19 containing hot ethcing solution. In the case of copper foil and a 30% ferric chloride at approximately 83° C. the immersion time will run from ½ to 3 minutes. This will reduce the thickness of the conductor by 10 to 40%. Reduction of less than 10% produces poor results. Reduction above 40% merely wastes conductor material. The preferred thickness reduction is from about 15% to 30%. The foil is then passed through another neutralizing bath or water rinse in tank 20. The foil should be dry before further treatment and if sufficient space is not available between the rinse 20 and the solution tank 22 to permit air drying, a heated dryer may be included at this point.

The composite, at this point, comprises a plurality of continuous metal foil conductor strips bonded to a continuous film backing of an aromatic polyimide or polyamide-imide resin. It is then passed through the resin precursor solution in tank 11 where a wet film, which may be described as a covering film, is deposited on both sides of the composite. On emerging from the resin solution tank, the composite passes between the grooved metering pins 23, 24 which distribute a uniform film on both sides and across the width of the composite. At the speed of about 5 feet per minute the coated foil passes through another tower or oven 25 at about 150–350° C. In this tower, as in the previous tower, the solvent is driven off and the precursor is cured to a solid resinous state. Here also numerous passes may be necessary to produce the desired final film thickness which may vary between 1 to 10 mils. The completed cable is wound up on take up reel 26.

FIG. 2 illustrates the various stages in the manufacture of the flat multiple conductor cable. In step A, we have illustrated an uncoated metal foil in a cross-sectional view. Step B shows the metal foil after the kiss-coating and curing step, which produces a resinous film on one side of the metal foil. Step C shows a resist coating applied to the exposed side of the metal foil, the resist coating defining essentially the parallel strip configuration desired for the metal foil conductors. The metal foil which is not covered by the resist coating is etched away, usually unevenly, leaving the srtucture illustrated in Step D. The remaining resist is removed to provide the composite of conductors, most of which have sharp edges, bonded to the resinous film backing as illustrated in Step E. These sharp, undercut conductor edges are smoothed or rounded off by an additional etching step to substantially provide the cross section illustrated in Step F. An additional coating of resinous film is applied to the composite to cover at least the exposed conductor surfaces and thus provide the completed insulated flat multiple conductor cable illustrated in Step G.

Figure 3:
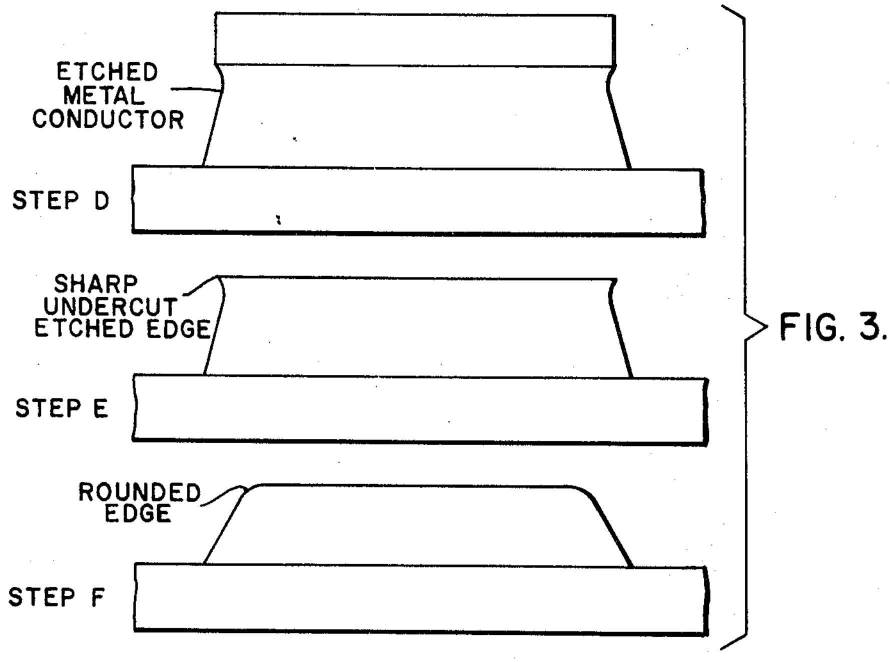
FIG. 3 is an enlarged illustration of several critical stages illustrated in FIG. 2.

FIG. 3 illustrates in greater detail Steps D, E and F above. As can be seen from Step E, if a final resinous film coating were applied over the etched metal conductor, the sharp undercut edge would notch into the coating. This would create a notch sensitive area along the entire length of the conductor. The round edge shown in Step F would eliminate this problem since no notch would be built into the final film coating. This step would be especially important when notch sensitive films are used as the final film coating. There is no notch sensitivity problem with the resinous film support because it is applied to a wide solid metal foil sheet prior to etching and before there are any sharp edges to notch into the film.

Figure 4:
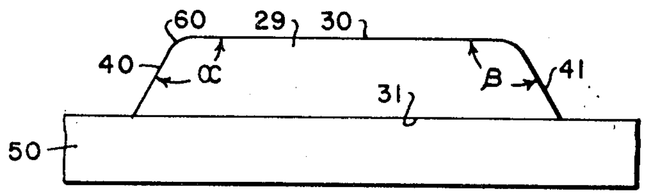
FIG. 4 is a cross-sectional illustration of the etched metallic foil.

FIG. 4 is a geometric illustration of the metal foil after the final etching step showing its basically trapezoidal cross section. The outward side, 30, is parallel to side 31, the side in contact with the flexible resinous film support 50. Extending sides 40 and 41 form obtuse angles $\alpha$ and $\beta$ respectively with outward side 30. The junctures, 60, of sides 40 and 41 with side 30 are substantially rounded.

The open face cable used in this work contained .075 inch conductors with spacing on 0.100 inch centers. The copper foil, etched to form the conductors, is originally fabricated by electrolytic-deposition which leaves the foil with one roughened surface. The resinous film backing is always coated onto this roughened surface for better adhesion.

EXAMPLE I

A 3.0 mil (2 ounce per square foot) electrolytic copper foil was kiss coated on one side with a dimethyl acetamide solution of an aromatic polyamide-imide amic acid precursor formed by the reaction of pyromellitic dianhydride (PMDA) and 3,4′-diaminobenzanilide containing 10 to 12% solids, by weight, and having a viscosity of 30 seconds (Zahn No. 4 at 31° C.). The wet film was then cured at about 350° C. to a solid resinous aromatic polyamide-imide film backing. Several coatings were applied on the one side and cured to build up the film thickness to 2 mils.

A resist coating of molten paraffin wax was deposited in a parallel strip pattern the molten wax solidifying and adhering to the uncoated side of the copper foil. The composite was then immersed in an aqueous solution containing 30% ferric chloride, by weight, at 90° C. for about 5 to 10 minutes so that the copper foil not protected or masked by the resist was etched away leaving strips of conductive copper foil, with sharp edges, in a parallel pattern. The resist coating was removed by immersion of the composite in a tank of trichloroethylene. This produced a composite of a 2 mil resin film backing having a plurality of flat metallic conductors 3 mils thick, with sharp edges, bonded to the backing.

The composite was immersed in an aqueous solution containing 30% ferric chloride by weight at 83° C. for 120° seconds. About one mil of copper was removed from the thickness of the conductor strips. The etching process was selective in that the copper was removed faster from the sharp edges than from the surface, which resulted in the edges becoming radiused or rounded off. Throughout, the aromatic polyamide-imide film remained unaffected by the etching solution.

The open face cable was then passed through a dimethyl acetamide, N-methylpyrrolidone and toluene solution of a soluble aromatic polyimide precursor derived from the reaction of equimolar quantities of the 4-acid chloride of trimellitic anhydride (prepared from trimellitic anhydride and sulfonyl chloride) and p,p'-methylene bis(dianiline). The solution contained 22% solids, by weight. The wet film was then cured for 2 hours at 140° C., followed by 2 hours at 200° C. to produce a solid resinous film covering over the conductors. Several passes were made and the film coverings were cured to build up the final cover film thickness to 2 mils.

The finished cable was flexed and creased parallel to the conductors by hand with no cracking.

EXAMPLE II

This process was identical to that described in Example I except the open face cable was immersed in the second ferric chloride bath (to round off the sharp conductor edges) at 83° C. for 80 seconds. Here approximately 0.7 mil of copper was removed from the thickness of the conductors. Again the edges were radiused. Both resinous films were cured out to the same thickness as in Example I.

The finished cable was flexed and creased parallel to the conductors by hand with no adverse effects.

EXAMPLE III

This process was identical to that described in Example I except the open face cable was immersed in the second ferric chloride bath (to round off the sharp conductor edges) at 83° C. but for only 40 seconds. Here 0.3 mil of copper was removed from the thickness of the conductor. Inspection of the edges with a 100 power microscope indicated that the edges were slightly radiused. Both resinous films were cured out to the same thickness as in Example I (a 2 mil resin film backing and a 2 mil resin film coating over the open face cable).

The finished cable was creased by hand along ten conductors and cracked in two places indicating a 20% notch sensitivity in the parallel direction. The 0.3 mil etch was not sufficient to totally eliminate the lengthwise cracking.

EXAMPLE IV

This process was identical to that described in Example I except that the final resin coating polyamic precursor was obtained from dissolving a powdered mixture of equimolar quantities of 4-acid chloride of trimellitic anhydride and p,p'-methylene bis(dianiline) in dimethyl acetamide to a 22% solids solution. This final resinous set film, as in Example I, was cured for 3 hours at 140° C. then for 1 hour at 160° C. followed by 1 hour at 200° C. to a solid resinous film coating. Several dippings were used and the film coverings cured to build up the film thickness to 2 mils.

No cracking occurred when the sample was flexed and creased by hand in the direction of the conductors.

EXAMPLE V

This process is identical to that described in Example I except that the open face cable with rounded off conductor edges was dipped through a 9 to 1 dimethyl acetamide and xylene solution of an aromatic polyamic-acid precursor formed by the reaction of benzophenone tetracarboxylic dianhydride (BTDA) and 4,4'-diaminophenyl ether containing 18 to 20% solids, by weight. The wet film was then cured for 4 hours at 140° C. followed by 2.5 hours at 200° C. to a solid resinous film coating. Several dippings were used and the film coverings cured to build up the film thickness to 2 mils.

The finished cable when creased by hand in directions both parallel and perpendicular to the conductors did not crack.

EXAMPLE VI

This process is identical to that described in Example I except that the open face cable with rounded off conductor edges was dipped through a final coating bath of a dimethyl acetamide solution of polyamic acid precursor formed by the reaction of pyromellitic dianhydride (PMDA) and 3,4-diaminobenzanilide containing 10 to 12% solids, by weight and having a viscosity of 30 seconds (Zahn No. 4 at 31° C.). This final resinous wet film, which in this example is the same resin film used in the film backings, was cured for 3.5 hours at 140° C. then 1 hour at 170° C. then 1 hour at 200° C. followed by 4 hours at 250° C. to a solid resinous film coating. Several dippings were used and the film coverings cured to build up the film thickness to 2 mils.

The sample was flexed and creased by hand parallel to the conductor without cracking.

EXAMPLE VII

All the samples prepared in Examples I through VI were folded and creased by hand in the direction perpendicular to the conductors i.e. folding a length of the finished cable back on itself. All samples except those prepared in Example V showed some cracks in the insulation when the second conformal coating was on the outside fold.

The sample prepared in Example V also withstood one full cycle of the NAS729 folding test. In this test the cable sample is folded 180° transversely and pressed between two metal plates with a pressure of 30 p.s.i. After 15 minutes the cable is unfolded and the pressure reapplied for 15 minutes. This action constitutes one cycle of folding and unfolding. There should be no evidence of insulation separation or cracking nor should there be discontinuity due to breaks in the conductors when cables are subjected to two cycles at 20° C.

The sample prepared in Example V showed no cracks on the first cycle of the NAS729 test, but cracked appreciably on the second cycle.

EXAMPLE VIII

This process is identical to that described in Example I except that a 4.2 mil (3 ounce per square foot) electrolytic copper foil was continuously kiss coated and cured to the same resinous film backing used in Example I but to a thickness of 3 mils. The composite was immersed in the second etching solution for 80 seconds, removing 0.7 mil from the copper conductor thickness and rounding off the sharp edges. The same final coating bath was used as in Example I except curing temperature was raised to 250° C. and final resin film coating thickness was increased to 3 mils.

Upon creasing the cable sample both longitudinally (parallel to conductors) and transversely (across conductors) by hand no failures due to cracking occurred.

EXAMPLE IX

This process was identical to that described in Example I except that a 4.2 mil (3 ounce per square foot) electrolytic copper foil was continuously kiss coated and cured from the same resinous precursor solution used in Example I but to a film thickness of 3 mils. The composite was immersed in the second etching solution for 80 seconds removing 0.7 mil from the conductor thickness and rounding off the sharp edges. The conductors were then plated with a thin nickel flash. This composite was then dipped through a final coating bath of dimethyl acetamide solution of precursor formed by the reaction of pyromellitic dianhydride (PMDA) and 4,4'-diaminophenyl ether and 3,4'-diaminobenzanilide containing 20% solids by weight. This final resinous wet film was cured for ½ hour at 210° C., then ½ hour at 250° C., then ½ hour at 290° C., followed by 15 minutes each at 300° C. The film coating thickness was built up to 3 mils.

The sample was flexed and creased by hand parallel and transverse to the conductors without cracking.

Samples of the cable, measuring 1.5 inches wide by 2 inches long were folded and creased according to the NAS729 fold and crease test. The use of a 4 mil film insert (shim) between the folds, when folded transversely, permitted the samples to pass two full cycles of the NAS729 specification described in Experiment VII.

EXAMPLE X

In this case two open face cables were prepared. Both used 3.0 mil (2 ounce per square foot) electrolytic copper foil. Both were kiss coated on one side with a dimethyl acetamide solution of a polyamic acid precursor formed by the reaction of pyromellitic dianhydride (PMDA) and 3,4'-diamino-benzanilide containing 10 to 12% solids, by weight and having a viscosity of 30 seconds (Zahn No. 4 at 31 C.) This wet film was cured at about 350° C. to a solid resinous film backing. Several coatings were applied on the one side and cured to build up the film thickness to 2 mils.

The same resist application and initial etching process was used as in Example I. However, the sharp copper conductor edges were not rounded off in this case.

One of the two open faced cables was dipped through the same kiss-coating solution used above. This wet film was then cured at about 300° C. to a solid resinous film coating. Several dippings were used and the film coverings cured to build up the film thickness to 1.5 mils.

The other open face cable was dipped through a 9–1 dimethyl acetamide and xylene solution of an aromatic polyamic acid precursor formed by the reaction of benzophenone tetracarboxylic dianhydride (BTDA) and 4,4'-diaminophenyl ether containing 20% solids, by weight. The wet film was then cured at 300° C., to insure maximum cure and flexibility, to a solid resinous film coating. Several dippings were used and the film coverings cured to build up the film thickness to 2.0 mils.

Upon creasing these non-radiused conductor cables lengthwise along the conductors both showed extensive cracking of the conformal insulation.

It should be apparent from the foregoing description that resinous insulating films of aromatic polyimide and/or aromatic polyamide-imide resins are apparently notch-sensitive and that the elimination of the sharp edges on the etched metal conductors associated therewith in accordance with this invention produces a marked improvement in crease resistance. The excellent insulating properties of these resins can now be advantageously employed in conductive structures where crease resistance is important. It should be equally apparent and understood that improvements in crease resistance may, in accordance with this invention, be obtained with other notch-sensitive insulating films and with etched metal foil conductor configurations other than those specifically described hereinabove. The invention may be advantageously employed wherever the sharp edges of etched metal foil conductor configurations have an adverse effect on the physical properties of the resinous film that is used to insulate the etched conductors.

Since certain changes in carrying out the above processes and in the above products may be made without departing from the scope of the invention, it is intended that the description and drawing be interpreted as illustrative and not limiting.

I claim as my invention:

1. A method of producing a flat flexible electrically conductive member having a plurality of spaced metal conductors from a laminated metal foil-flexible resin backing film strip, which comprises:

(a) providing a resist coating on the metal foil side of the strip in a predetermined pattern outlining a plurality of spaced conductors on the foil,
(b) etching to dissolve the metal from the resist free areas of the foil to form a plurality of spaced metal foil conductors supported by the flexible resin backing film, said conductors having relatively sharp edges,
(c) removing the resist coating to expose the metal conductors,
(d) etching the metal conductors to round said sharp edges, and
(e) coating the exposed conductors with a flexible covering film of a resin selected from the group consisting of aromatic polyimide and aromatic polyamide-imide resins.

2. The method of claim 1 wherein the metal foil is a foil of a metal selected from the group consisting of copper and aluminum.

3. A method of producing a flat flexible electrically conductive member having a plurality of spaced metal conductors from a laminated metal foil-flexible resin backing film strip, said film being a film of a resin selected from the group consisting of aromatic polyimide and aromatic polyamide-imide resins, which comprises:

(a) providing a resist coating on the metal foil side of the strip in a predetermined pattern outlining a plurality of spaced conductors on the foil,
(b) etching to dissolve the metal from the resist free areas of the foil to form a plurality of spaced metal foil conductors supported by the flexible resin backing film, said conductors having relatively sharp edges,
(c) removing the resist coating to expose the metal conductors,
(d) etching the metal conductors to round said sharp edges, and
(e) coating the exposed conductors with a flexible covering film of a resin selected from the group consisting of aromatic polyimide and aromatic polyamide-imide resins.

4. The method of claim 3 wherein said films are of a resin having the recurring unit:

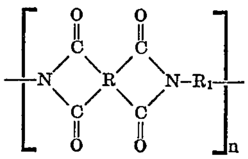

wherein $n$ is at least 15, R is at least one tetravalent organic radical selected from the group consisting of

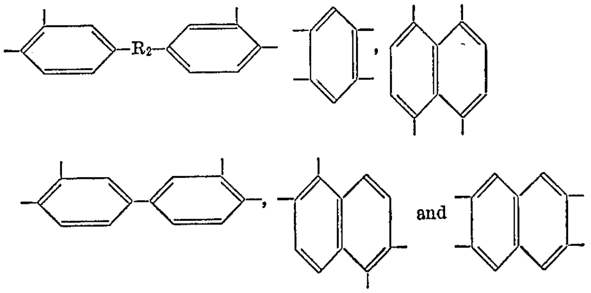

$R_2$ being selected from the group consisting of divalent aliphatic hydrocarbon radicals having from 1 to 4 carbon atoms, carbonyl, oxygen, sulfur and sulfonyl radicals and in which $R_1$ is at least one divalent radical selected from the group consisting of:

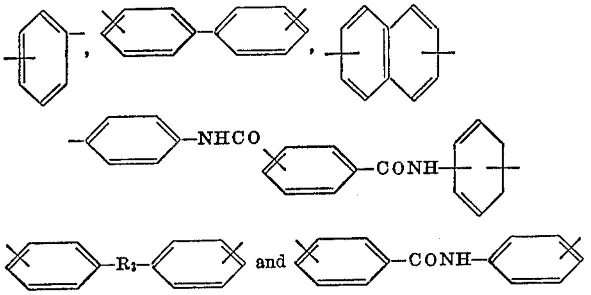

in which $R_3$ is a divalent organic radical selected from the group consisting of $R_2$, silico and amido radicals.

5. The method of claim 3 wherein said films are films of a resin having the recurring structure:

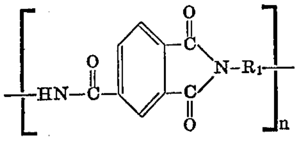

wherein $R_1$ is at least one divalent radical selected from the gorup consisting of:

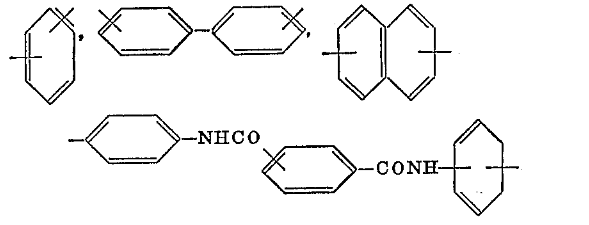

in which $R_3$ is a divalent organic radical selected from the group consisting of silico, amido radicals, divalent aliphatic hydrocarbon radicals having from 1 to 4 carbon atoms, carbonyl, oxygen, sulfur and sulfonyl radicals.

6. A flexible electrically conductive member comprising a flexible resinous backing film, a plurality of thin flat spaced metal foil conductor strips supported by said film, said metal foil conductors having a substantially trapezoidal cross section with a first side in contact with said barking film, an outward side shorter than and substantially parallel to said first side, two sides extending outwardly from said first side to said outward side, the extending sides and the outward side forming obtuse angles, the junctures of said outward side and said extending sides being rounded, a flexible covering film of a resin selected from the group consisting of aromatic polyimide and aromatic polyamide-imide resins deposited over said conductor strips and onto said backing film so that the conductor strips are sandwiched between said films.

7. The electrically conductive member of claim 6 wherein the backing film is a film of a resin selected from the group consisting of aromatic polyimide and aromatic polyamide-imide resins.

8. The electrically conductive member of claim 7 wherein said films are films of a resin having the recurring unit:

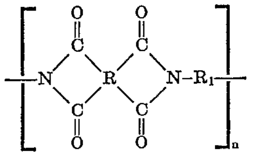

wherein $n$ is at least 15, R is at least one tetravalent organic radical selected from the group consisting of

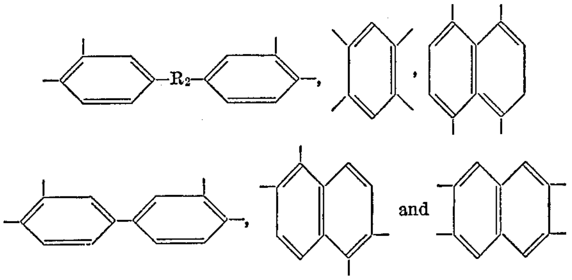

$R_2$ being selected from the group consisting of divalent aliphatic hydrocarbon radicals having from 1 to 4 carbon atoms, carbonyl, oxygen, sulfur and sulfonyl radicals and in which $R_1$ is at least one divalent radical selected from the group consisting of:

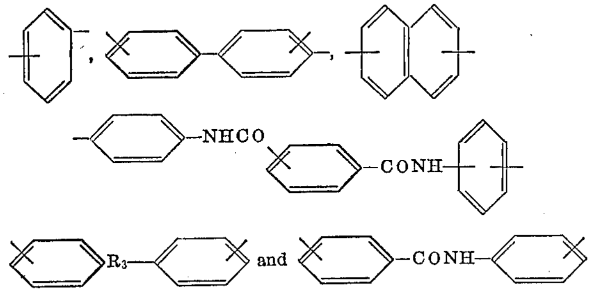

in which $R_3$ is a divalent organic radical selected from the group consisting of $R_2$, silico and amido radicals.

9. The electrically conductive member of claim 7 wherein said films are films of a resin having the recurring unit:

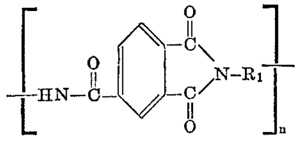

wherein $R_1$ is at least one divalent radical selected from the group consisting of:

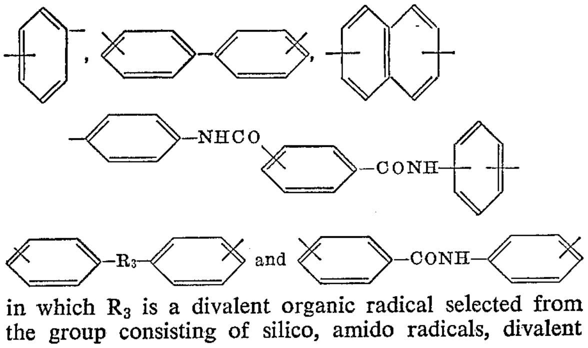

in which $R_3$ is a divalent organic radical selected from the group consisting of silico, amido radicals, divalent aliphatic hydrocarbon radicals having from 1 to 4 carbon atoms, carbonyl, oxygen, sulfur and sulfonyl radicals.

10. The flexible electrically conductive member of claim 7 wherein said metal foil is a foil of a metal selected from the group consisting of copper and aluminum.

References Cited

UNITED STATES PATENTS

| | | | |
|---|---|---|---|
| 3,174,920 | 3/1965 | Post | 156—8X |
| 3,210,226 | 10/1965 | Young | 156—8 |
| 3,428,486 | 2/1969 | George | 117—218 |
| 3,442,703 | 5/1969 | Naselow | 117—218 |
| 3,451,848 | 6/1969 | Stephens | 117—218X |

ALFRED L. LEAVITT, Primary Examiner

A. GRIMALDI, Assistant Examiner

U.S. Cl. X.R.

117—217, 218; 156—8, 22